(12) United States Patent
Hashimoto et al.

(10) Patent No.: US 8,203,380 B2
(45) Date of Patent: Jun. 19, 2012

(54) SEMICONDUCTOR DEVICE

(75) Inventors: Takayuki Hashimoto, Tokai (JP); Takashi Hirao, Hitachi (JP); Noboru Akiyama, Hitachinaka (JP)

(73) Assignee: Renesas Electronics Corporation, Kanagawa (JP)

( * ) Notice: Subject to any disclaimer, the term of this patent is extended or adjusted under 35 U.S.C. 154(b) by 63 days.

(21) Appl. No.: 12/483,668

(22) Filed: Jun. 12, 2009

(65) Prior Publication Data

US 2010/0001790 A1 Jan. 7, 2010

(30) Foreign Application Priority Data

Jul. 1, 2008 (JP) ................... 2008-172165

(51) Int. Cl.
*H01L 25/00* (2006.01)
(52) U.S. Cl. .................. 327/566; 327/109; 327/112
(58) Field of Classification Search .......... 327/564–566, 327/109, 112
See application file for complete search history.

(56) References Cited

U.S. PATENT DOCUMENTS

| 6,114,903 A * | 9/2000 | Bach ............................ 327/565 |
| 6,460,168 B1 * | 10/2002 | Yamamoto et al. ............... 716/8 |
| 2007/0170897 A1 * | 7/2007 | Williams ....................... 323/222 |

FOREIGN PATENT DOCUMENTS

| JP | 2005-057050 | 3/2005 |
| JP | 2005-203766 | 7/2005 |

* cited by examiner

*Primary Examiner* — Quan Tra
(74) *Attorney, Agent, or Firm* — Brundidge & Stanger, P.C.

(57) ABSTRACT

In a semiconductor device, a high-side driver is arranged in a region closer to a periphery of a semiconductor substrate than a high-side switch, and a low-side driver is arranged in a region closer to the periphery of the semiconductor substrate than the low-side switch. By this means, a path from a positive terminal of an input capacitor to a negative terminal of the input capacitor via the high-side switch and the low-side switch is short, a path from a positive terminal of a drive capacitor to a negative terminal of the drive capacitor via the low-side driver is short, and a path from a positive terminal of a boot strap capacitor to a negative terminal of the boot strap capacitor via the high-side driver is short, and therefore, the parasitic inductance can be reduced, and the conversion efficiency can be improved.

6 Claims, 7 Drawing Sheets

Prior Art

SEMICONDUCTOR DEVICE

CROSS-REFERENCE TO RELATED APPLICATION

The present application claims priority from Japanese Patent Application No. JP 2008-172165 filed on Jul. 1, 2008, the content of which is hereby incorporated by reference into this application.

TECHNICAL FIELD OF THE INVENTION

The present invention relates to a semiconductor device used for a power converter such as a power supply. More particularly, the present invention relates to a technique effectively applied to a non-isolated DC-DC converter.

BACKGROUND OF THE INVENTION

For example, according to the studies about a power converter such as a power supply by the present inventors, a power supply by a synchronous rectification method has been used so often with the achievement of low voltage driving of a power supply used for a CPU (Central Processing Unit) such as a computer. Also, the current slew rate (di/dt) required for the CPU power supply has been increasing more and more, and therefore, the development of a higher-speed power supply has been important for suppressing ripple of an output voltage of the power supply.

FIG. 1 shows a circuit diagram of a general non-isolated DC-DC converter for converting a direct-current voltage. An input capacitor Cin is arranged in parallel with an input power supply Vin. A drive capacitor Cdrive is inserted in parallel with a drive power supply Vdrive for driving a high-side switch Q1 and a low-side switch Q2, thereby supplying power to a low-side driver 33. A driver circuit for the high-side switch Q1 has a boot strap configuration, and when the high-side switch Q1 is turned off, current is supplied from the drive power supply Vdrive to a boot strap capacitor Cboot via a boot strap diode Dboot, thereby becoming a power supply for a high-side driver 32.

The high-side switch Q1 and the low-side switch Q2 are alternately turned on and off by receiving a PWM signal from a power supply controller 31, so that square waves are outputted to a terminal Vx and the square waves are smoothed to a direct-current voltage by an output filter configured with an output inductor L and an output capacitor Cout, thereby supplying power to a CPU 34 to be a load. Diodes D1 and D2 are connected in antiparallel to the high-side switch Q1 and the low-side switch Q2, respectively, and the diode D1 assumes a role of ensuring a current path to the input power supply Vin when a potential of the Vx to be one terminal of the output inductor L is increased. Also, the diode D2 assumes a role of ensuring a return current path of the output inductor L when the high-side switch Q1 is turned off. The synchronous rectification means an operation that the low-side switch Q2 is turned on to switch the current path from the diode D2 to the low-side switch Q2 when the return current flows in the diode D2, and this can reduce the conduction loss because on-resistance of the low-side switch Q2 is significantly low compared to the diode D2. When a MOSFET (Metal Oxide Semiconductor Field Effect Transistor) is used as the low-side switch Q2 as shown in FIG. 1, since a built-in diode is provided on the same semiconductor substrate, an external diode is unnecessary.

Conventionally, a discrete package power MOSFET is used as the high-side switch Q1 and the low-side switch Q2 of a non-isolated DC-DC converter, a driver IC including the high-side driver 32 and the low-side driver 33 for driving these switches is provided in a different package from the discrete package, and the switches are connected to the drivers on a printed board, respectively.

However, as the current slew rate (di/dt) of the power supply becomes larger, the reduction of conversion efficiency due to influences of a parasitic inductance on the printed board and a parasitic inductance caused by wire bonding in the package becomes nonnegligible.

Also, gate resistance and driver resistance exiting in the discrete package become the cause of decreasing the conversion efficiency of the DC-DC converter as well with the development of the high-speed power supply. For solving the problem, a monolithic structure in which the high-side switch Q1 and the low-side switch Q2, and the high-side driver 32 and the low-side driver 33 for driving these switches are mounted on the same semiconductor substrate has been proposed (for example, in Japanese Patent Application Laid-Open Publication No. 2005-203766: Patent Document 1). By mounting the high-side switch Q1 and the low-side switch Q2, and the high-side driver 32 and the low-side driver 33 for driving these switches on the same semiconductor substrate, the parasitic inductances can be reduced and the conversion efficiency of the power supply can be improved.

SUMMARY OF THE INVENTION

However, the high-side driver 32 and the low-side driver 33 are arranged in a center region of the semiconductor substrate in a conventional structure disclosed in the above-described Patent Document 1 and the like, and therefore, there is a problem of path lengths among the input capacitor Cin, the drive capacitor Cdrive, and the boot strap capacitor Cboot, which are arranged so as to surround the semiconductor device. That is, a path from a positive terminal of the input capacitor Cin to a negative terminal of the input capacitor Cin via the high-side switch Q1 and the low-side switch Q2 is long, a path from a positive terminal of the drive capacitor Cdrive to a negative terminal of the drive capacitor Cdrive via the low-side driver 33 of the low-side switch Q2 is long, and a path from a positive terminal of the boot strap capacitor Cboot to a negative terminal of the boot strap capacitor Cboot via the high-side driver 32 of the high-side switch Q1 is long, and therefore, there are problems of the large parasitic inductance and the low conversion efficiency.

Accordingly, the present invention has been made for solving the problems of the above-described conventional structure, and an object of the present invention is to provide a semiconductor device of non-isolated DC-DC converter which has the reduced parasitic inductance and the high conversion efficiency.

The above and other objects and novel characteristics of the present invention will be apparent from the description of the present specification and the accompanying drawings.

The typical embodiments of the inventions disclosed in the present application will be briefly described as follows.

That is, in the typical embodiment, a semiconductor device includes a high-side switch, a high-side driver, a low-side switch, and a low-side driver, which are formed on the same semiconductor substrate, wherein the high-side driver is arranged in a region closer to a periphery of a semiconductor substrate than the high-side switch, and the low-side driver is arranged in a region closer to the periphery of the semiconductor substrate than the low-side switch. Alternatively, in the semiconductor device, the high-side driver is arranged in each of regions closer to the periphery of the semiconductor substrate and the center of the semiconductor substrate than the high-side switch, and the low-side driver is arranged in each of regions closer to the periphery of the semiconductor substrate and the center of the semiconductor substrate than the low-side switch.

Also, in a semiconductor device in which the high-side switch, the high-side driver, and the low-side driver are formed on a different semiconductor substrate from a semiconductor substrate on which the low-side switch is formed, the high-side driver is arranged in a region closer to the periphery of the semiconductor substrate than the high-side switch, and the low-side driver is arranged in a region closer to the periphery of the semiconductor substrate than the high-side switch.

The effects obtained by typical aspects of the present invention disclosed in the present application will be briefly described below.

That is, as the effects obtained by the typical aspects, in a semiconductor device including a high-side switch, a high-side driver, a low-side switch, and a low-side driver, a path from a positive terminal of the input capacitor to a negative terminal of the input capacitor via the high-side switch and the low-side switch is short, a path from a positive terminal of the drive capacitor to a negative terminal of the drive capacitor via the low-side driver of the low-side switch is short, and a path from a positive terminal of the boot strap capacitor to a negative terminal of the boot strap capacitor via the high-side driver of the high-side switch is short among the input capacitor, the drive capacitor, and the boot strap capacitor which are arranged so as to surround the semiconductor device, and therefore, the parasitic inductance can be reduced and the conversion efficiency can be improved.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 2:
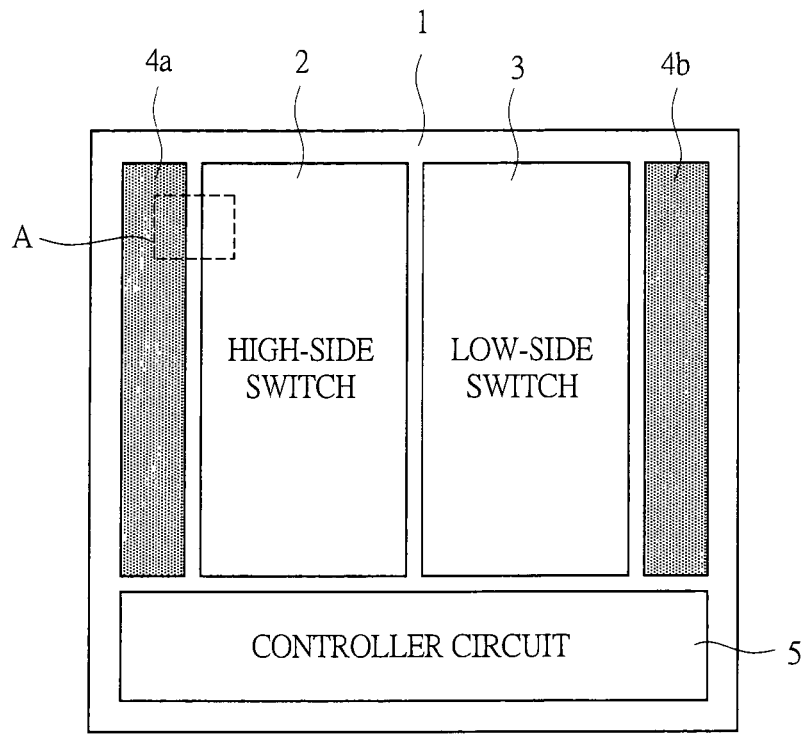
FIG. 2 is a layout view showing a semiconductor device according to a first embodiment of the present invention.

First, a semiconductor device according to a first embodiment of the present invention will be described with reference to FIG. 2. FIG. 2 is a layout view showing the semiconductor device according to the present embodiment. FIG. 2 is an illustration viewing the semiconductor device from a connecting portion side.

Figure 1:
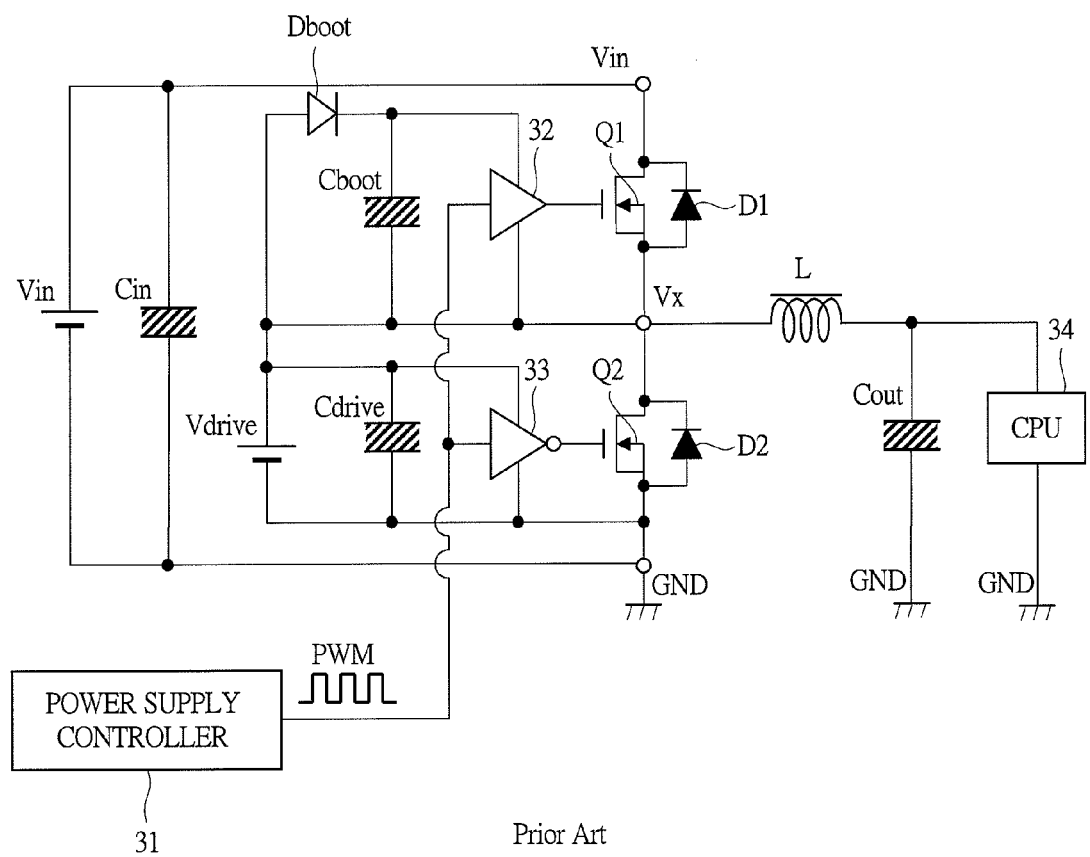
FIG. 1 is a circuit diagram showing a configuration of a general non-isolated DC-DC converter.

The semiconductor device according to the present embodiment is applied to a non-isolated DC-DC converter as shown in FIG. 1 described above. That is, the semiconductor device of the non-isolated DC-DC converter includes a high-side switch Q1, a high-side driver 32, a low-side switch Q2, and a low-side driver 33. The high-side switch Q1 is configured with a lateral MOSFET whose drain is connected to an input power supply Vin and whose source is connected to an output inductor L. The high-side driver 32 is a driver for driving the high-side switch Q1 and is connected to a gate of the lateral MOSFET of the high-side switch Q1. The low-side switch Q2 is configured with a lateral MOSFET whose drain is connected to the output inductor L and whose source is connected to a reference potential GND. The low-side driver 33 is a driver for driving the low-side switch Q2 and is connected to a gate of the lateral MOSFET of the low-side switch Q2.

In the semiconductor device according to the present embodiment, the lateral MOSFET is used for the high-side switch Q1 and the low-side switch Q2, and this advantage including a difference from a vertical MOSFET and the like will be described in detail in a third embodiment later.

Note that, in the correspondence relation between the layout view of FIG. 2 showing the semiconductor device according to the present embodiment and the circuit diagram of FIG. 1 described above, a high-side switch 2 corresponds to the high-side switch Q1 (diode D1: high-side built-in MOSFET), a high-side driver 4a corresponds to the high-side driver 32, a low-side switch 3 corresponds to the low-side switch Q2 (diode D2: low-side built-in MOSFET), a low-side driver 4b corresponds to the low-side driver 33, and a controller circuit 5 corresponds to the power supply controller 31, respectively, and they represent the same components.

As shown in FIG. 2, in the semiconductor device according to the present embodiment, the high-side switch 2 and the low-side switch 3, the high-side driver 4a for driving the high-side switch 2 and the low-side driver 4b for driving the low-side switch 3, and the controller circuit 5 for controlling the high-side driver 4a and the low-side driver 4b are mounted on a semiconductor substrate 1. More particularly, in the semiconductor device according to the present embodiment, the high-side driver 4a is arranged in a region closer to a periphery of the semiconductor substrate 1 than the high-side switch 2, and the low-side driver 4b is arranged in a region closer to the periphery of the semiconductor substrate 1 than the low-side switch 3. An n-type MOSFET or a p-type MOSFET is used as the high-side switch 2, and an n-type MOSFET is used as the low-side switch 3. Although a circuit is simplified when the p-type MOSFET is used as the high-side switch 2 because the boot strap capacitor Cboot and the boot strap diode Dboot shown in FIG. 1 are unnecessary, the p-type MOSFET has a problem of high on-resistance, and therefore, the n-type MOSFET is used in many cases as the high-side switch 2 in a CPU power supply for which large current is required.

Figure 3:
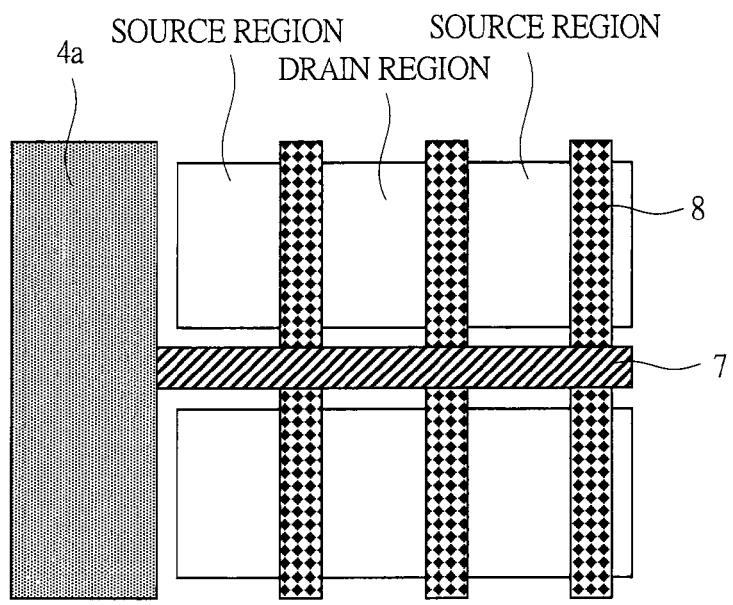
FIG. 3 is an enlarged layout view of A region of FIG. 2.

FIG. 3 shows an enlarged layout view of A region of FIG. 2. A gate electrode of an aluminum wire 7 is extended rightward from the high-side driver 4a in FIG. 3, and a gate electrode of a poly silicon wire 8 is extended so as to branch from the gate electrode of the aluminum wire 7, so that a source region and a drain region are arranged so as to interpose the gate electrode of the poly silicon wire 8. The MOSFET of the high-side switch 2 is configured with the gate electrode, the source region and the drain region interposing the gate electrode therebetween, and the like. The reason of using an aluminum wire for a long wire and a poly silicon wire for a short wire in wires of the gate electrodes is because a resistance of the aluminum wire is lower and the increase of the gate resistance can be suppressed even if the wires are long.

Figure 4:
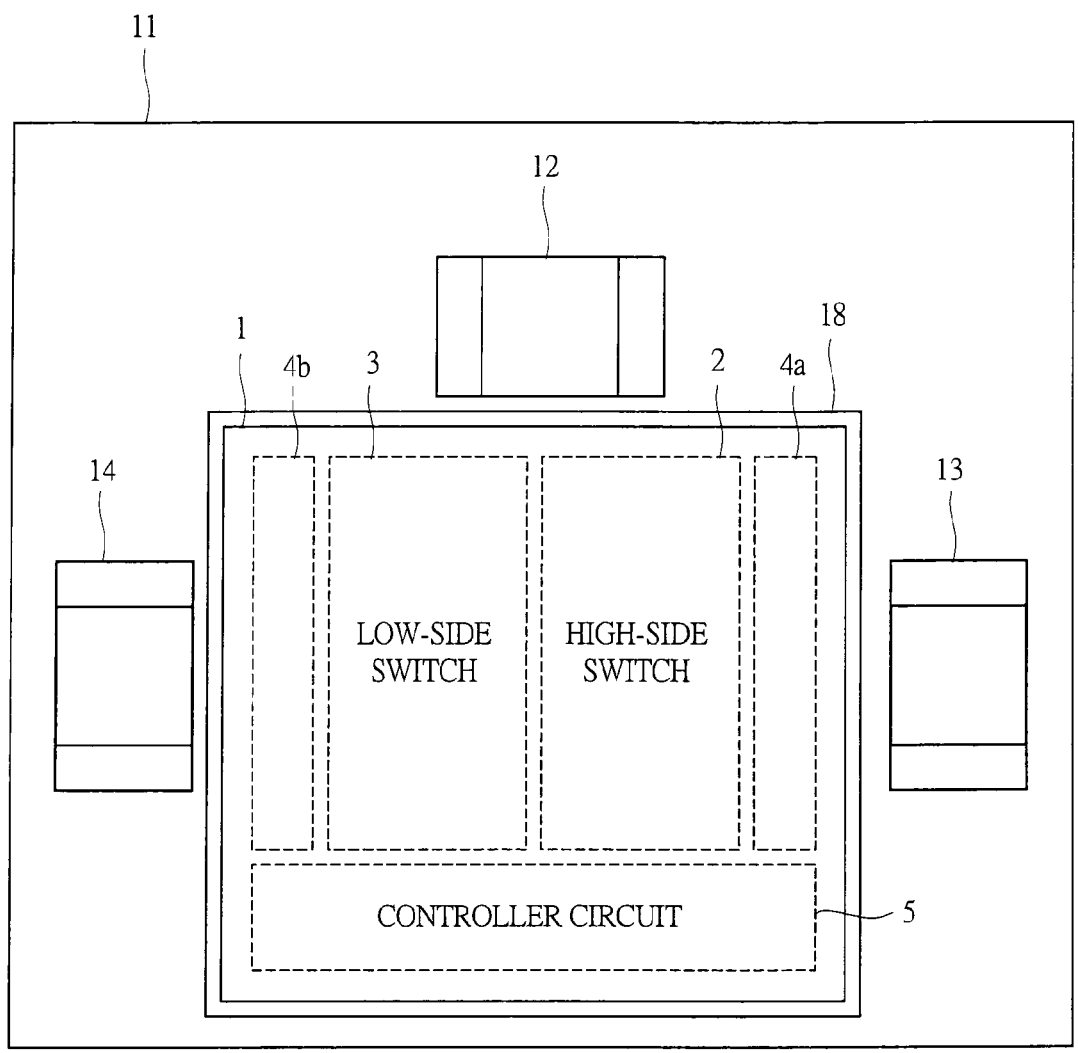
FIG. 4 is a layout view showing a printed board on which the semiconductor device according to the first embodiment of the present invention is mounted.

Next, the reason why the parasitic inductance can be reduced by the semiconductor device according to the present embodiment will be described with reference to FIG. 4. FIG. 4 is a layout view showing a printed board on which the semiconductor device according to the present embodiment is mounted.

FIG. 4 shows a state in which the semiconductor substrate 1 is stored in a semiconductor package 18 and they are flip-chip mounted on a printed board 11. Since the semiconductor substrate 1 is flip-chip mounted, right and left of the semiconductor substrate 1 are inverted with those of FIG. 2.

An input capacitor 12, a boot strap capacitor 13, and a drive capacitor 14 are arranged so as to surround the semiconductor package 18. Since the input capacitor 12 is arranged close to the high-side switch 2 and the low-side switch 3, a path from one terminal of the input capacitor 12 to the other terminal of the input capacitor 12 via the high-side switch 2 and the low-side switch 3 is short, so that the parasitic inductance can be reduced. Further, since the boot strap capacitor 13 is arranged close to the high-side driver 4a, a path from one terminal of the boot strap capacitor 13 to the other terminal of the boot strap capacitor 13 via the high-side driver 4a is short, so that the parasitic inductance can be reduced. Still further, since the drive capacitor 14 is arranged close to the low-side driver 4b, a path from one terminal of the drive capacitor 14 to the other terminal of the drive capacitor 14 via the low-side driver 4b is short, so that the parasitic inductance can be reduced. As a result, this leads to the improvement of the power conversion efficiency.

Note that, in the correspondence relation between the layout view of FIG. 4 and the circuit diagram of FIG. 1 described above, the input capacitor 12 corresponds to the input capacitor Cin, the boot strap capacitor 13 corresponds to the boot strap capacitor Cboot, and the drive capacitor 14 corresponds to the drive capacitor Cdrive, respectively.

Figure 5:
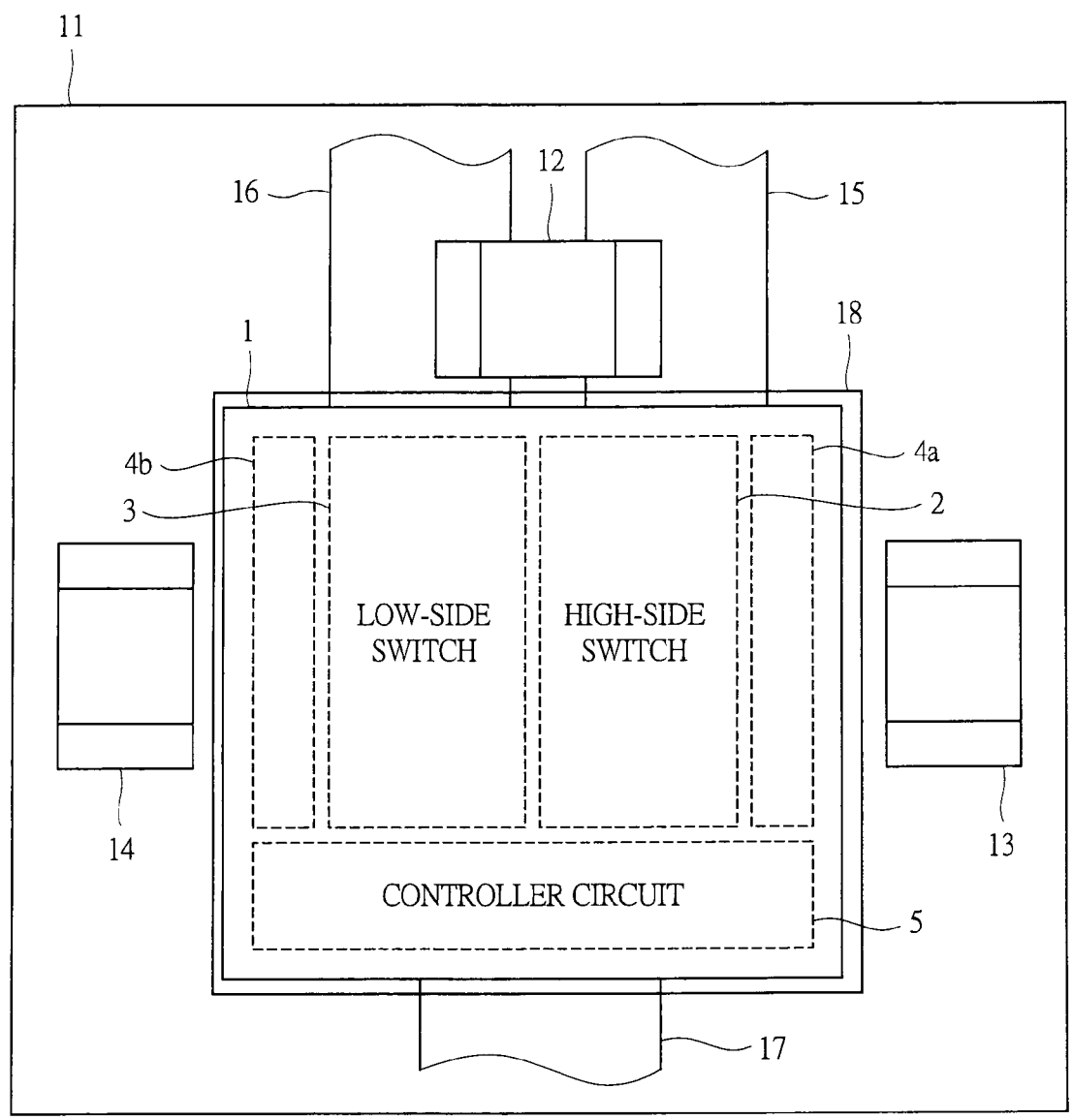
FIG. 5 is a layout view showing a state where wires are added to the printed board of FIG. 4.

FIG. 5 is a layout view showing a state where wires of the path from a positive terminal of the input power supply Vin to a negative terminal of the input power supply Vin via the high-side switch Q1 (2) and the low-side switch Q2 (3) are added to the printed board 11 of FIG. 4. As shown in FIG. 5, a power supply wire 15 connected to the positive terminal of the input power supply Vin and a reference potential wire (GND wire) 16 connected to the negative terminal of the input power supply Vin are arranged close to each other. This aims to cancel the magnetic flux caused in switching of the high-side switch 2 by arranging the power supply wire 15 and the reference potential wire 16 close to each other, thereby reducing the effective parasitic inductance. Meanwhile, it is not required to consider a parasitic inductance in an output wire 17 connected to the output inductor L. However, since reduction of its conversion efficiency due to the wire resistance is concerned, it is necessary to ensure a sufficiently large wire width.

Figure 6:
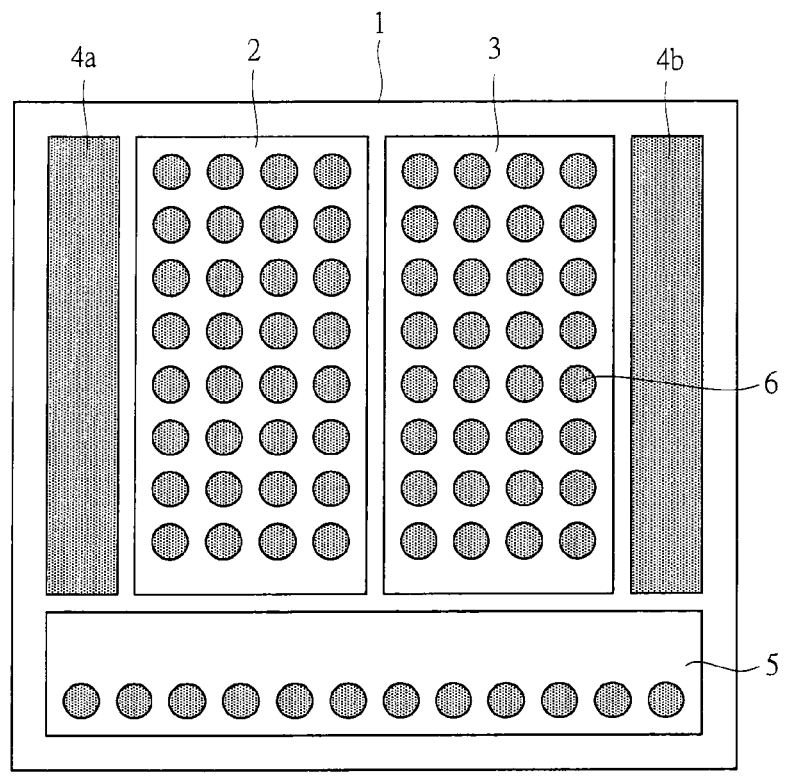
FIG. 6 is a layout view describing a connecting portion to a semiconductor package or the printed board in the semiconductor device according to the first embodiment of the present invention.

FIG. 6 is a layout view describing a connecting portion between the semiconductor package 18 or the printed board 11 and the semiconductor substrate 1 on which the high-side switch 2, the low-side switch 3, and the controller circuit 5 are formed. FIG. 6 shows an example of using bumps 6 for the connection of the semiconductor substrate 1 on which the high-side switch 2, the low-side switch 3, and the controller circuit 5 are formed. The semiconductor substrate 1 is connected to the printed board 11 via the bumps 6. Also in a case of storing the semiconductor substrate 1 in the semiconductor package 18 and mounting them on the printed board 11, the semiconductor package 18 is connected to the printed board 11 via the bumps 6. As described above, in the present embodiment, the bumps 6 are used for the connecting portion in both of the semiconductor device in the state of the semiconductor substrate 1 and the semiconductor device in which the semiconductor substrate 1 is stored in the semiconductor package 18.

Conventionally, the wire bonding used for the connection between the semiconductor substrate 1 and the semiconductor package 18 has following problems. That is, an upper limit of the number of pins is low because bonding pads have to be provided in the periphery of the semiconductor substrate 1, and the wire resistance is high because the wires have to be led to the pads arranged in the periphery of the semiconductor substrate 1. Compared to this, since the bumps 6 can be the connecting portion in the whole semiconductor substrate 1, many pins can be provided. Also, since the connection is made from the center region of the semiconductor substrate 1 to the semiconductor package 18 or the printed board 11 via the bumps 6, the increase of the wire resistance caused by leading the wires of the semiconductor substrate 1 can be suppressed.

Figure 7:
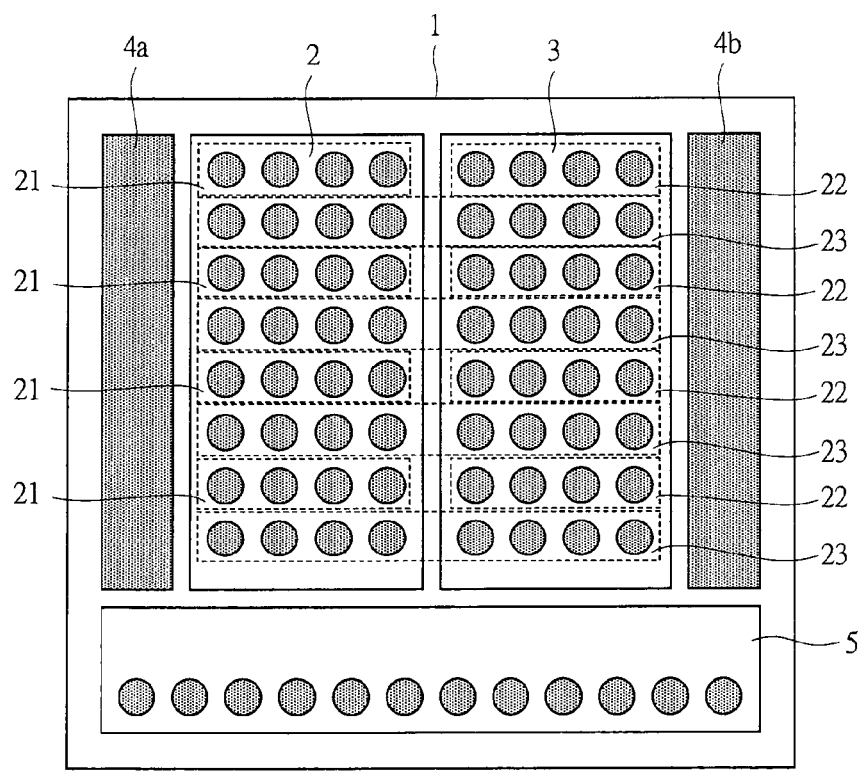
FIG. 7 is a layout view arranged with focusing on the potential of bumps of the connecting portion of FIG. 6.
Figure 8:
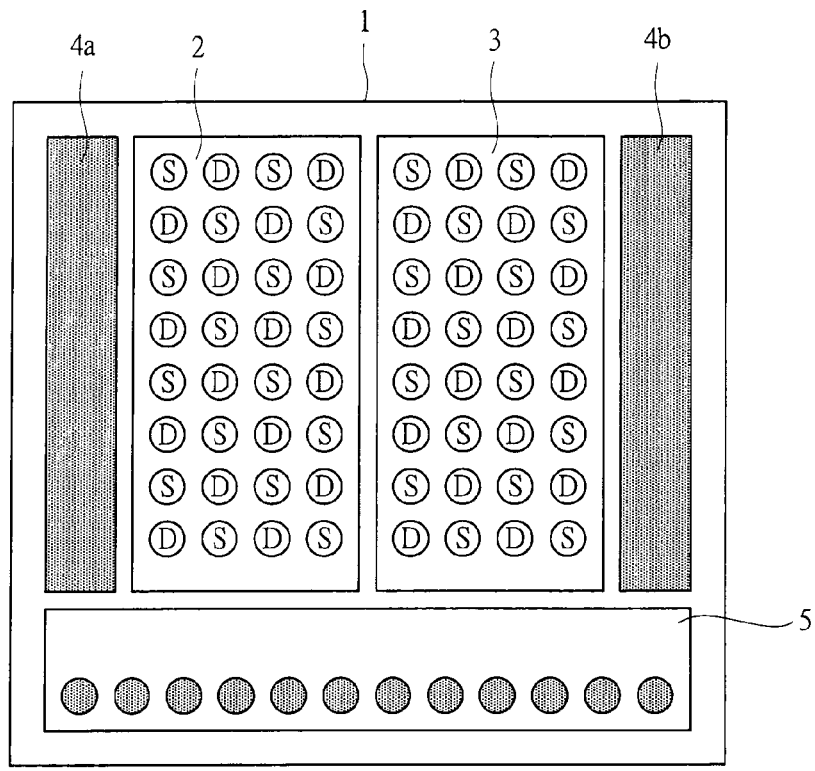
FIG. 8 is a layout view arranged with focusing on source electrodes and drain electrodes of the bumps of the connecting portion of FIG. 6.

With regard to the arrangement of the bumps 6, for example, a layout example focusing on the potential as shown in FIG. 7 or that focusing on the electrodes as shown in FIG. 8 described later is possible.

FIG. 7 is a layout view arranged with focusing on the potential of the bumps of the high-side switch 2 and the low-side switch 3. As shown in FIG. 7, bumps 21 corresponding to the drain potential of the high-side switch 2 are connected to the positive terminal of the input power supply Vin, bumps 23 corresponding to the source potential of the high-side switch 2 and the drain potential of the low-side switch 3 are connected to one terminal of the output inductor L, and bumps 22 corresponding to the source potential of the low-side switch 3 are connected to the negative terminal of the input power supply Vin. In this case, the bumps 21 corresponding to the drain potential and the bumps 23 corresponding to the source potential are alternately arranged in a vertical direction in the high-side switch 2, and the bumps 22 corresponding to the source potential and the bumps 23 corresponding to the drain potential are alternately arranged in a vertical direction in the low-side switch 3. In this arrangement, the bumps 23 are arranged at the same positions in the high-side switch 2 and the low-side switch 3 when viewed in a vertical direction. By alternately arranging the bumps of the source and the drain as described above, the length of leading the wires of the semiconductor substrate 1 can be shortened, and the improvement of the conversion efficiency can be achieved.

FIG. 8 is a layout view arranged with focusing on the source electrodes and the drain electrodes of the bumps of the high-side switch 2 and the low-side switch 3. In FIG. 8, a symbol "S" indicates the source and a symbol "D" indicates the drain, respectively. As shown in FIG. 8, in the high-side switch 2, the bump of the source S and the bump of the drain D are alternately arranged in a lateral direction, and further, the bump of the source S and the bump of the drain D are alternately arranged also in a vertical direction. Similarly, also in the low-side switch 3, the bump of the source S and the bump of the drain D are alternately arranged in lateral and vertical directions. By alternately arranging the bumps of the source S and the drain D as described above, the length of leading the wires of the semiconductor substrate 1 can be shortened, and the improvement of the conversion efficiency can be achieved.

As described above, according to the present embodiment, in a semiconductor device in which the high-side switch 2, the high-side driver 4a, the low-side switch 3, the low-side driver 4b, and the like are formed on the same semiconductor substrate 1, the high-side driver 4a is arranged in a region closer to the periphery of the semiconductor substrate 1 than the high-side switch 2, and further, the low-side driver 4b is arranged in a region closer to the periphery of the semiconductor substrate 1 than the low-side switch 3, and therefore, the paths among the input capacitor 12, the boot strap capacitor 13, and the drive capacitor 14 are shortened. As a result, the parasitic inductance is reduced, and the conversion efficiency can be improved.

Further, according to the semiconductor device of the present embodiment, further improvement of the conversion efficiency is possible by devising the arrangement of the power supply wire 15 and the reference potential wire 16 and the arrangement of the output wire 17 and using the bumps 6 for the connecting portion and devising the arrangement of the bumps.

Second Embodiment

Figure 9:
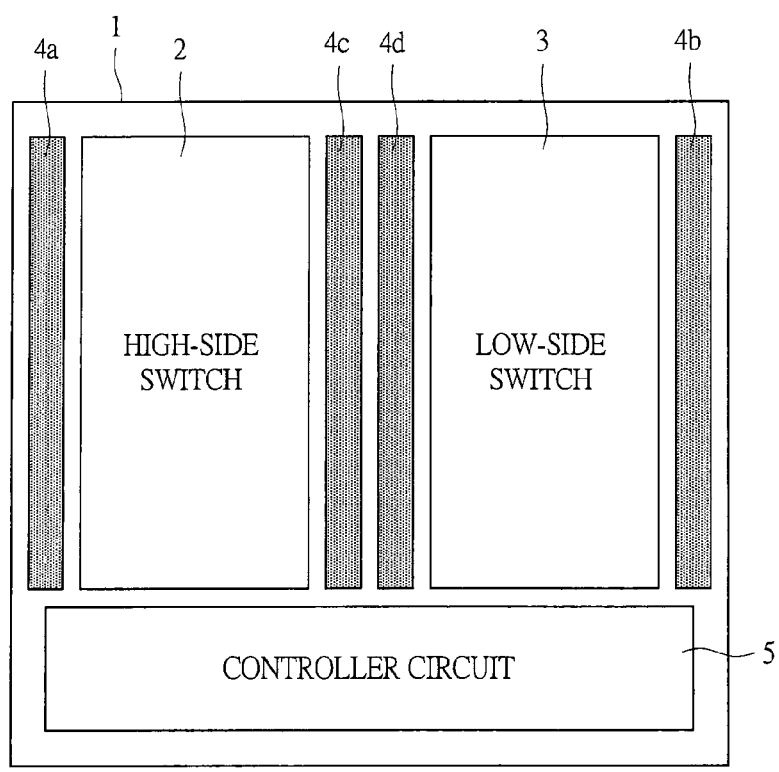
FIG. 9 is a layout view showing a semiconductor device according to a second embodiment of the present invention.

FIG. 9 is a layout view showing a semiconductor device according to a second embodiment of the present invention.

A different point of the semiconductor device according to the present embodiment from that of the first embodiment is that not only the high-side driver 4a and the low-side driver 4b arranged in the regions closer to the periphery of the semiconductor substrate 1 but also a high-side driver 4c and a low-side driver 4d arranged in a region closer to the center of the semiconductor substrate 1 are provided as the drivers for the high-side switch 2 and the low-side switch 3. By arranging the drivers in the periphery region and the center region in this manner, distances from the high-side drivers 4a and 4c to the high-side switch 2 become short and distances from the low-side drivers 4b and 4d to the low-side switch 3 become short, so that further improvement of the conversion efficiency can be expected compared to the first embodiment.

For example, in FIG. 1 described above, a voltage of the input power supply Vin is 12 V and its output voltage is approximately 1 V to be an operation voltage of the CPU 34, and therefore, the ON ratio of the high-side switch Q1 is as low as approximately one twelfth. Accordingly, most of the loss component of the low-side switch Q2 is the conduction loss, and therefore, it is effective to reduce the ON resistance of the low-side switch Q2 for the improvement of the conversion efficiency.

As described above, according to the present embodiment, in a semiconductor device in which the high-side switch 2, the high-side drivers 4a and 4c, the low-side switch 3, the low-side drivers 4b and 4d, and the like are formed on the same semiconductor substrate 1, the high-side drivers 4a and 4c are arranged in the regions closer to the periphery of the semiconductor substrate 1 and the center of the semiconductor substrate 1 than the high-side switch 2, and the low-side drivers 4b and 4d are arranged in the regions closer to the periphery of the semiconductor substrate 1 and the center of the semiconductor substrate 1 than the low-side switch 3, and therefore, the parasitic inductance can be further reduced and the conversion efficiency can be further improved compared to the first embodiment.

Further, also in the semiconductor device according to the present embodiment, similarly to the first embodiment, the further improvement of the conversion efficiency is possible by devising the arrangement of the power supply wire and the reference potential wire and the arrangement of the output wire, and using the bumps for the connecting portion and devising the arrangement of the bumps.

Third Embodiment

When switches and drivers for driving the switches are mounted on the same semiconductor substrate like in the above-described first and second embodiments, a semiconductor device used as the switches is a lateral MOSFET. In the lateral MOSFET, the source region and the drain region are formed on a surface of the semiconductor substrate, and the source electrode and the drain electrode are also formed on the surface of the semiconductor substrate (one example of the lateral MOSFET is disclosed in Patent Document 1). The lateral MOSFET can have a large current capacity per unit area of the semiconductor substrate when breakdown voltage is low, but it is required to lengthen a distance between the source and the drain in the lateral direction when breakdown voltage is high, and therefore, the current capacity becomes small.

Compared to this, in a vertical MOSFET, a region for maintaining the voltage between the source and the drain is arranged in the vertical direction of the semiconductor substrate, and it is not required to lengthen the distance in the lateral direction of the semiconductor substrate even when breakdown voltage becomes high, and therefore, the current capacity per unit area of the semiconductor substrate can be increased compared to the lateral MOSFET in a device with high breakdown voltage over 30 V, so that the ON resistance can be reduced (the vertical MOSFET is disclosed in, for example, Japanese Patent Application Laid-Open Publication No. 2005-57050).

Accordingly, it is effective for the improvement of the conversion efficiency to mount the low-side switch Q2 of the vertical MOSFET on a semiconductor substrate different from the semiconductor substrate on which the high-side switch Q1, the high-side driver 4a for driving the high-side switch Q1, and the low-side driver 4b for driving the low-side switch Q2 are mounted.

Figure 10:
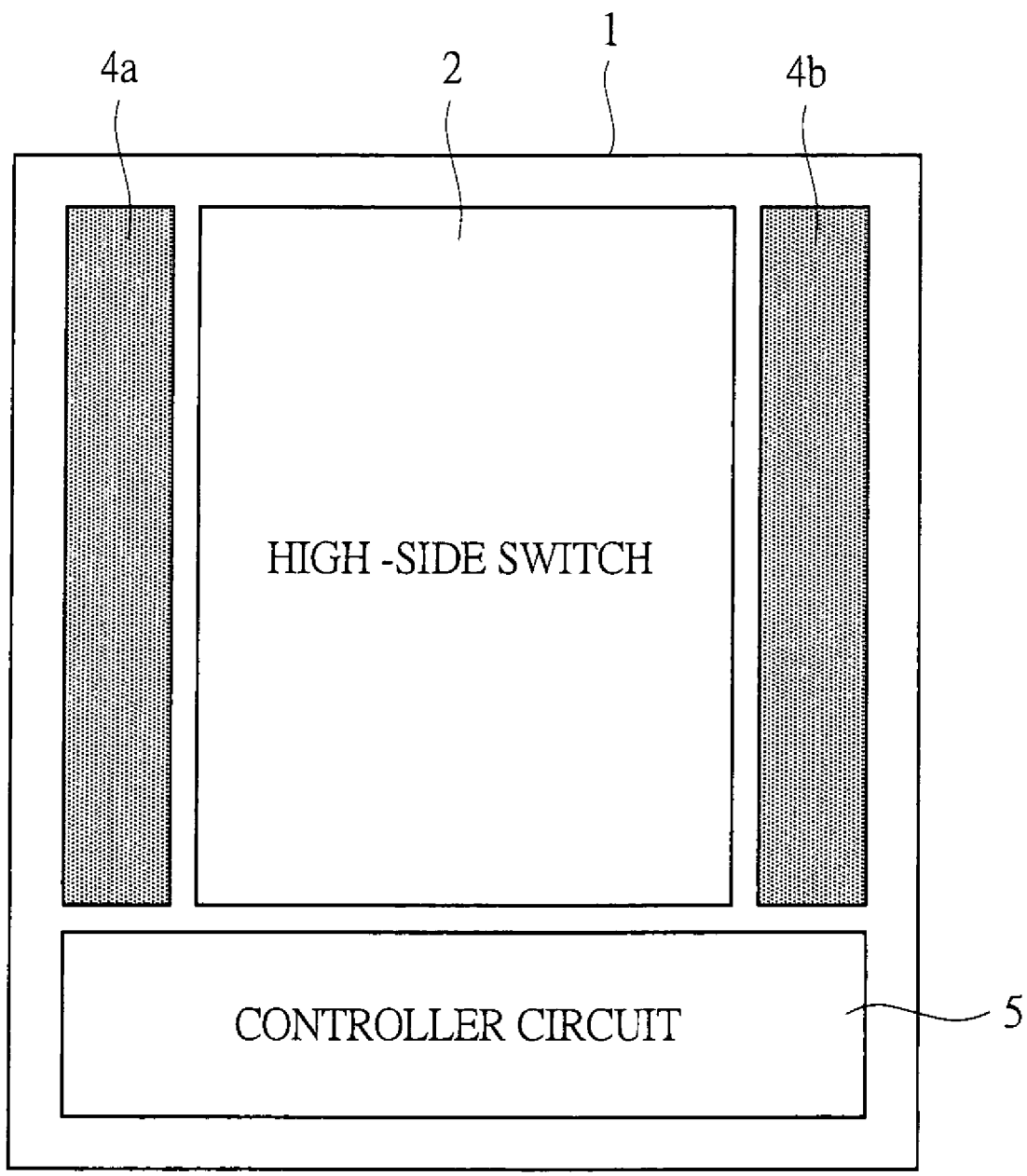
FIG. 10 is a layout view showing a semiconductor device according to a third embodiment of the present invention.

FIG. 10 is a layout view showing a semiconductor device according to the third embodiment of the present invention. FIG. 10 shows the semiconductor substrate 1 on which the high-side switch 2, the high-side driver 4a for driving the high-side switch 2, the low-side driver 4b for driving the low-side switch 3, and the controller circuit 5 for controlling the high-side driver 4a and the low-side driver 4b are mounted in the case where the low-side switch 3 is mounted on the different semiconductor substrate from the semiconductor substrate 1.

Also in the present embodiment, the high-side driver 4a and the low-side driver 4b are arranged in the regions closer to the periphery of the semiconductor substrate 1 than the high-side switch 2. By this means, similarly to the first embodiment, the path among the input capacitor 12, the boot strap capacitor 13, and the drive capacitor 14, which are arranged so as to surround the semiconductor device becomes short, so that the parasitic inductance can be reduced.

Further, by using the vertical MOSFET as the low-side switch 3 and mounting it on the semiconductor substrate 5 different from the semiconductor substrate 1 shown in FIG. 10, the ON resistance of the low-side switch 3 can be reduced, so that the conversion efficiency can be improved. Also, as an advantage of using the lateral MOSFET as the high-side switch 2, since the lateral MOSFET has a small feedback capacity between the source and the drain compared to the vertical MOSFET, a switching loss can be reduced.

Note that, in the semiconductor device according to the present embodiment, the semiconductor substrate 1 on which the high-side switch 2, the high-side driver 4a, the low-side driver 4b, and the controller circuit 5 are mounted and the semiconductor substrate on which the low-side switch 3 is mounted are stored in the same semiconductor package.

As described above, according to the present embodiment, in a semiconductor device in which the high-side switch 2, the high-side driver 4a, the low-side switch 3, the low-side driver 4b, and the like are provided and the high-side switch 2, the high-side driver 4a, and the low-side driver 4b are formed on the semiconductor substrate 1 different from the semiconductor substrate on which the low-side switch 3 is formed, the high-side driver 4a is arranged in the region closer to the periphery of the semiconductor substrate 1 than the high-side switch 2, the low-side driver 4b is arranged in the region closer to the periphery of the semiconductor substrate 1 than the high-side switch 2, and the vertical MOSFET is mounted as the low-side switch 3 on the different semiconductor substrate, and therefore, the parasitic inductance can be further reduced and the conversion efficiency can be further improved compared to the first embodiment.

Further, also in the semiconductor device according to the present embodiment, similarly to the first embodiment, the further improvement of the conversion efficiency is possible by devising the arrangement of the power supply wire and the reference potential wire and the arrangement of the output wire, and using the bumps for the connecting portion and devising the arrangement of the bumps.

In the foregoing, the invention made by the inventors of the present invention has been concretely described based on the embodiments. However, it is needless to say that the present invention is not limited to the foregoing embodiments and various modifications and alterations can be made within the scope of the present invention.

The semiconductor device according to the present invention can be used for a semiconductor device used for a power converter such as a power supply. More particularly, the semiconductor device is effectively applied to a non-isolated DC-DC converter.

What is claimed is:

1. A semiconductor device comprising:
a high-side switch having a drain electrically connected to an input power supply potential and a source electrically connected to an output wire;
a high-side driver for driving the high-side switch, electrically connected to an external bootstrap capacitor;
a low-side switch having a drain electrically connected to the output wire and a source electrically connected to a reference potential wire; and
a low-side driver for driving the low-side switch, electrically connected to an external drive capacitor,
the high-side switch, the high-side driver, the low-side switch, and the low-side driver being formed on the same semiconductor substrate, wherein
the high-side driver is arranged on a periphery side of the high-side switch in a region closer to a first periphery of the semiconductor substrate than the high-side switch;
the low-side driver is arranged on a periphery side of the low-side switch in a region closer to a second periphery of the semiconductor substrate than the low-side switch,
the high-side driver is arranged between the bootstrap capacitor and a region where the high-side switch is formed,
the low-side driver is arranged between the drive capacitor and a region where the low-side switch is formed, and
the periphery side of the high-side switch and the periphery side of the low-side switch are oppositely positioned to each other so as to sandwich the high-side switch and the low-side switch therebetween.

2. The semiconductor device according to claim 1, wherein bumps are used for connecting portions of the high-side switch and the low-side switch.

3. The semiconductor device according to claim 1, wherein a lateral MOSFET is used for the high-side switch and the low-side switch.

4. A semiconductor device comprising:
a high-side switch having a drain electrically connected to an input power supply potential and a source electrically connected to an output wire;
a high-side drivers for driving the high-side switch, including a first high-side driver electrically connected to an external bootstrap capacitor;
a low-side switch having a drain electrically connected to the output wire and a source electrically connected to a reference potential wire; and
a low-side drivers for driving the low-side switch, including a first low-side driver electrically connected to an external drive capacitor,
the high-side switch, the high-side drivers, the low-side switch, and the low-side drivers being formed on the same semiconductor substrate, wherein
the first high-side driver is arranged on a periphery side of the high-side switch in a region closer to a first periphery of the semiconductor substrate than the high-side switch, and a second one of the high-side drivers is arranged in a region closer to the center of the semiconductor substrate than the high-side switch;
the first low-side driver is arranged on a periphery side of the low-side switch in a region closer to a second periphery of the semiconductor substrate than the low-side switch, and a second one of the low-side drivers is arranged in a region closer to the center of the semiconductor substrate than the low-side switch;
the first high-side driver is arranged between the bootstrap capacitor and a region where the high-side switch is formed,
the first low-side driver is arranged between the drive capacitor and a region where the low-side switch is formed, and
the periphery side of the high-side switch and the periphery side of the low-side switch are oppositely positioned to each other so as to sandwich the high-side switch and the low-side switch therebetween.

5. The semiconductor device according to claim 4, wherein bumps are used for connecting portions of the high-side switch and the low-side switch.

6. The semiconductor device according to claim 4, wherein a lateral MOSFET is used for the high-side switch and the low-side switch.

* * * * *